(12) United States Patent
Zhang et al.

(10) Patent No.: US 8,791,014 B2
(45) Date of Patent: Jul. 29, 2014

(54) METHODS OF FORMING COPPER-BASED CONDUCTIVE STRUCTURES ON SEMICONDUCTOR DEVICES

(75) Inventors: Xunyuan Zhang, Albany, NY (US); Hoon Kim, Guilderland, NY (US); Chanro Park, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 204 days.

(21) Appl. No.: 13/422,439

(22) Filed: Mar. 16, 2012

(65) Prior Publication Data

US 2013/0244422 A1 Sep. 19, 2013

(51) Int. Cl.
*H01L 21/768* (2006.01)

(52) U.S. Cl.
USPC .................................... 438/653; 257/E21.584

(58) Field of Classification Search
CPC .................. H01L 21/76805; H01L 21/76807; H01L 21/76849; H01L 21/76843
USPC .................................................. 438/652, 637
See application file for complete search history.

(56) References Cited

U.S. PATENT DOCUMENTS

| | | | |
|---|---|---|---|
| 5,639,691 A | 6/1997 | Klein et al. | |
| 5,646,448 A | 7/1997 | Klein et al. | |
| 5,851,367 A | 12/1998 | Nguyen et al. | |
| 6,002,176 A | 12/1999 | Nguyen et al. | |
| 6,376,370 B1 | 4/2002 | Farrar | |
| 6,524,644 B1 | 2/2003 | Wengenroth | |
| 6,541,374 B1 | 4/2003 | de Felipe et al. | |
| 6,794,288 B1 | 9/2004 | Kolics et al. | |
| 7,192,871 B2* | 3/2007 | Maekawa et al. | 438/695 |
| 7,207,096 B2 | 4/2007 | Gambino et al. | |
| 7,483,258 B2 | 1/2009 | Chen et al. | |
| 2002/0119245 A1* | 8/2002 | Verhaverbeke | 427/58 |
| 2003/0148618 A1 | 8/2003 | Parikh | |
| 2006/0024948 A1* | 2/2006 | Oh et al. | 438/622 |
| 2007/0284744 A1* | 12/2007 | Dubin et al. | 257/751 |
| 2009/0079077 A1* | 3/2009 | Yang et al. | 257/751 |
| 2009/0111234 A1 | 4/2009 | Chen et al. | |
| 2010/0003406 A1* | 1/2010 | Lam et al. | 427/255.391 |
| 2010/0314765 A1* | 12/2010 | Liang et al. | 257/751 |
| 2011/0108990 A1 | 5/2011 | Bonilla et al. | |

* cited by examiner

*Primary Examiner* — Mohsen Ahmadi
*Assistant Examiner* — Alia Sabur
(74) *Attorney, Agent, or Firm* — Amerson Law Firm, PLLC

(57) ABSTRACT

Disclosed herein are various methods of forming copper-based conductive structures on semiconductor devices, such as transistors. In one example, the method involves performing a first etching process through a patterned metal hard mask layer to define an opening in a layer of insulating material, performing a second etching process through the opening in the layer of insulating material that exposes a portion of an underlying copper-containing structure, performing a wet etching process to remove the patterned metal hard mask layer, performing a selective metal deposition process through the opening in the layer of insulating material to selectively form a metal region on the copper-containing structure and, after forming the metal region, forming a copper-containing structure in the opening above the metal region.

22 Claims, 5 Drawing Sheets

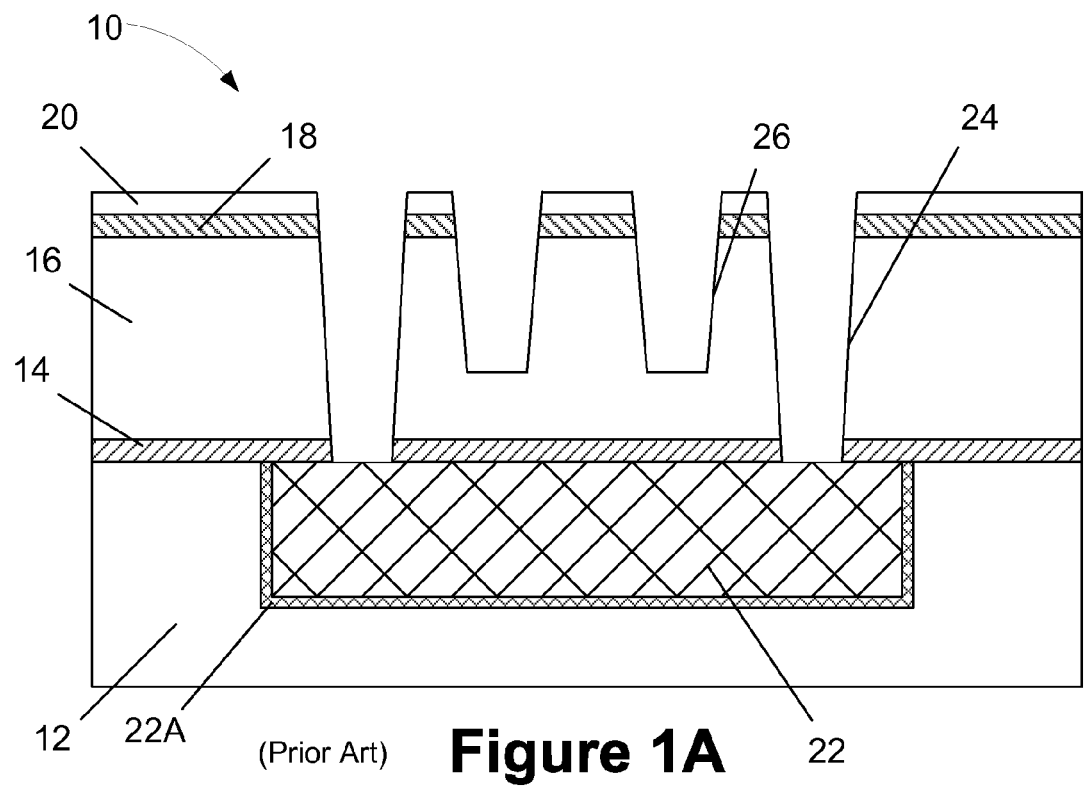
(Prior Art) Figure 1A
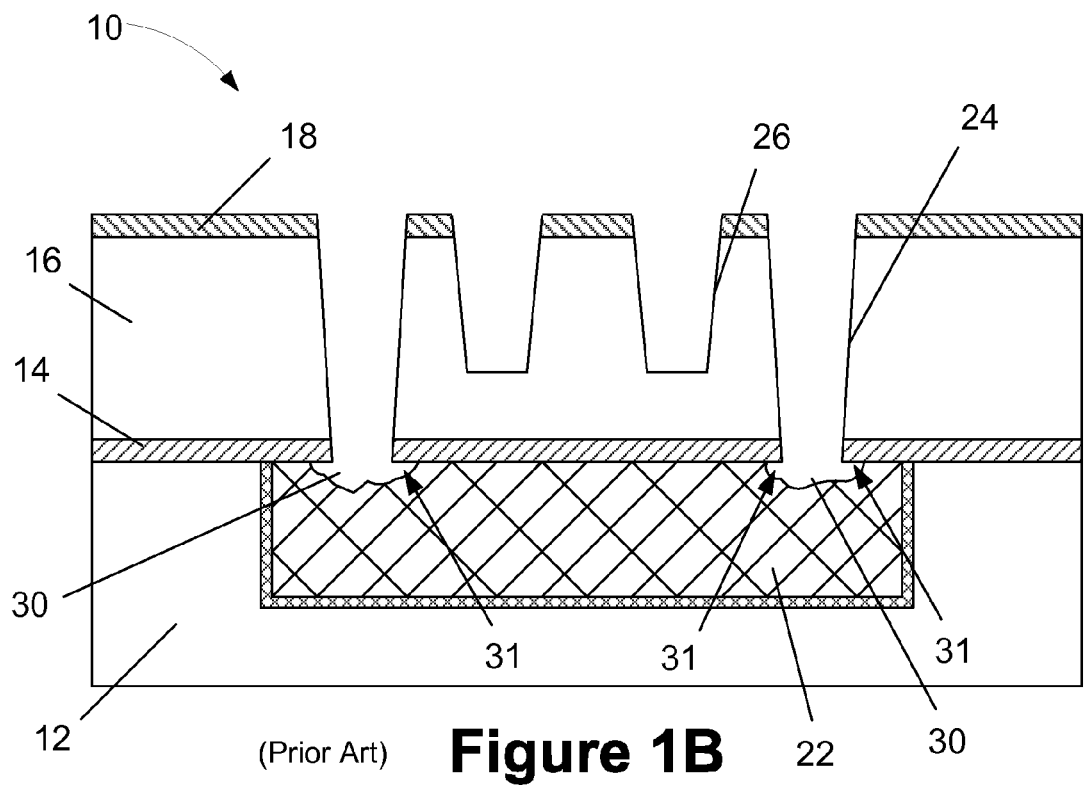
(Prior Art) Figure 1B

US 8,791,014 B2

METHODS OF FORMING COPPER-BASED CONDUCTIVE STRUCTURES ON SEMICONDUCTOR DEVICES

BACKGROUND OF THE INVENTION

1. Field of the Invention

Generally, the present disclosure relates to the manufacture of semiconductor devices, and, more specifically, to various methods of forming copper-based conductive structures on semiconductor devices, such as transistors.

2. Description of the Related Art

The fabrication of advanced integrated circuits, such as CPU's, storage devices, ASIC's (application specific integrated circuits) and the like, requires the formation of a large number of field effect transistors (NMOS and PMOS transistors) that substantially determine performance of the integrated circuits. Device designers are under constant pressure to increase the operating speed and electrical performance of transistors and integrated circuit products that employ such transistors. Thus, in modern ultra-high density integrated circuits, device features, like the channel length, have been steadily decreased in size to enhance the performance of the transistors and the overall functionality of the circuit. Given that the channel length (the distance between the source and drain regions) on modern transistor devices may be approximately 30-50 nm, and that further scaling is anticipated in the future, device designers have employed a variety of additional techniques in an effort to improve device performance, e.g., the use of high-k dielectrics, the use of highly-conductive copper lines and vias to provide electrical wiring connections to the transistors, the use of metal gate electrode structures, the incorporation of work function metals in the gate electrode structure and the use of channel stress engineering techniques on transistors (create a tensile stress in the channel region for NMOS transistors and create a compressive stress in the channel region for PMOS transistors).

However, the ongoing shrinkage of feature sizes on transistor devices causes certain problems that may at least partially offset the advantages that may be obtained by reduction of the device features. Generally, as the device dimensions have decreased, the physical size of the conductive interconnections, e.g., metal lines and metal vias formed in multiple metallization layers above the device level, have also become smaller. Accordingly, the electrical resistance of conductive interconnections becomes a significant issue in the design of the overall product. Moreover, the reduction in size of the conductive interconnections makes it more difficult to manufacture copper conductive lines and vias without introducing an unacceptable level of voids in the resulting structure.

FIGS. 1A-1B depict portions of an illustrative prior art process flow for forming various illustrative examples of copper conductive structures, e.g., copper lines and vias. FIG. 1A depicts an illustrative device 10 comprised of a layer of insulating material 12, an etch stop layer 14, another layer of insulating material 16, a dielectric hard mask layer 18 and a metal hard mask layer 20. Also depicted in FIG. 1A is a conductive copper structure 22 (with an illustrative barrier layer 22A), e.g., a copper line, positioned in the layer of insulating material 12, and a plurality of openings 24, 26 formed in the depicted stack of materials. The openings 24 expose portions of the conductive copper structure 22. The various layers depicted in FIG. 1A may be comprised of a variety of different materials. For example, the layers of insulating material 12, 16 may be comprised of a low-k material (k value less than about 3.5), the etch stop layer 14 may be comprised of silicon nitride, the hard mask layer 18 may be a TEOS-based layer of silicon dioxide, and the metal hard mask layer 20 may be made of, for example, titanium nitride.

The device 10 depicted in FIG. 1A was subjected to various known processing operations. For example, the conductive copper structure 22 was formed in the first layer of insulating material 12 using known techniques for forming such structures, e.g., damascene techniques. Thereafter, the various layers 14, 16, 18 and 20 were formed on the device 10 using known deposition techniques, e.g., chemical vapor deposition (CVD), physical vapor deposition (PVD), etc. Thereafter, the metal hard mask layer 20 was patterned using known photolithographic tools and techniques. Next, using the patterned metal hard mask layer 20 as an etch mask, the openings 24, 26 were formed in the depicted layers of material by performing a plurality of etching processes. FIG. 1A depicts the device 10 after an etching process was performed on the etch stop layer 14 through the openings 24 in the layer of insulating material 16 to thereby expose portions of the underlying conductive copper structure 22.

FIG. 1B depicts the device 10 after a wet etching process has been performed to remove the patterned metal hard mask 20. In the case where the metal hard mask 20 is comprised of titanium nitride, the wet etching process may be performed using diluted hydrogen peroxide ($H_2O_2$) or diluted ammonia ($NH_3OH$) and an $H_2O_2$ mixture. Unfortunately, the wet etching process performed to remove the metal hard mask 20 also attacks the underlying copper conductive structure 22 resulting in the formation of illustrative voids 30. The voids 30 tend to be non-uniform in nature and also tend to exhibit a significant degree of undercutting in the regions indicated by the arrows 31. As a result of the presence of the voids 30, the formation of conductive copper structures (not shown) in the openings 24 is very difficult and may lead to the formation of voids in any such conductive copper structure. As one example, attempts to form conductive copper structures in the openings 24 typically involve initially performing a deposition process to form a barrier layer (not shown) in the opening 24 and thereafter forming a conductive copper structure above the barrier layer using known electroplating or electroless plating techniques. Unfortunately, due to the presence of the voids 30, and the undercutting caused by such voids 30, the barrier layer cannot reliably fill the voids 30, thereby leaving undesirable voids in the final conductive structure for the device 10.

The present disclosure is directed to various methods of forming copper-based conductive structures on semiconductor devices, such as transistors, that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed various methods of forming copper-based conductive structures on semiconductor devices, such as transistors. In one example, the method involves performing a first etching process through a patterned metal hard mask layer to define an opening in a layer of insulating material, performing a second etching process through the opening in the layer of insulating material that exposes a portion of an underlying copper-containing structure, performing a wet etching process to remove the patterned metal hard mask layer, performing a selective metal deposition process through the opening in the layer of insulating material to selectively form a metal region on the copper-containing structure and, after forming the metal region, forming a copper-containing structure in the opening in the layer of insulating material above the metal region.

In another illustrative embodiment, the method involves performing a first etching process through a patterned metal hard mask layer to define an opening in a layer of insulating material, performing a second etching process through the opening in the layer of insulating material that exposes a portion of an underlying copper-containing structure, performing a wet etching process to remove the patterned metal hard mask layer, wherein the wet etching process results in the formation of a void in the underlying copper-containing structure, performing a selective metal deposition process through the opening in the layer of insulating material to selectively form a metal region that substantially fills said void in the copper-containing structure and, after forming the metal region, forming a copper-containing structure in the opening in the layer of insulating material above the metal region.

BRIEF DESCRIPTION OF THE DRAWINGS

The disclosure may be understood by reference to the following description taken in conjunction with the accompanying drawings, in which like reference numerals identify like elements, and in which:

FIGS. 1A-1B depict portions of one illustrative prior art process flow for forming copper conductive structures on a semiconductor device.

Figure 2A:
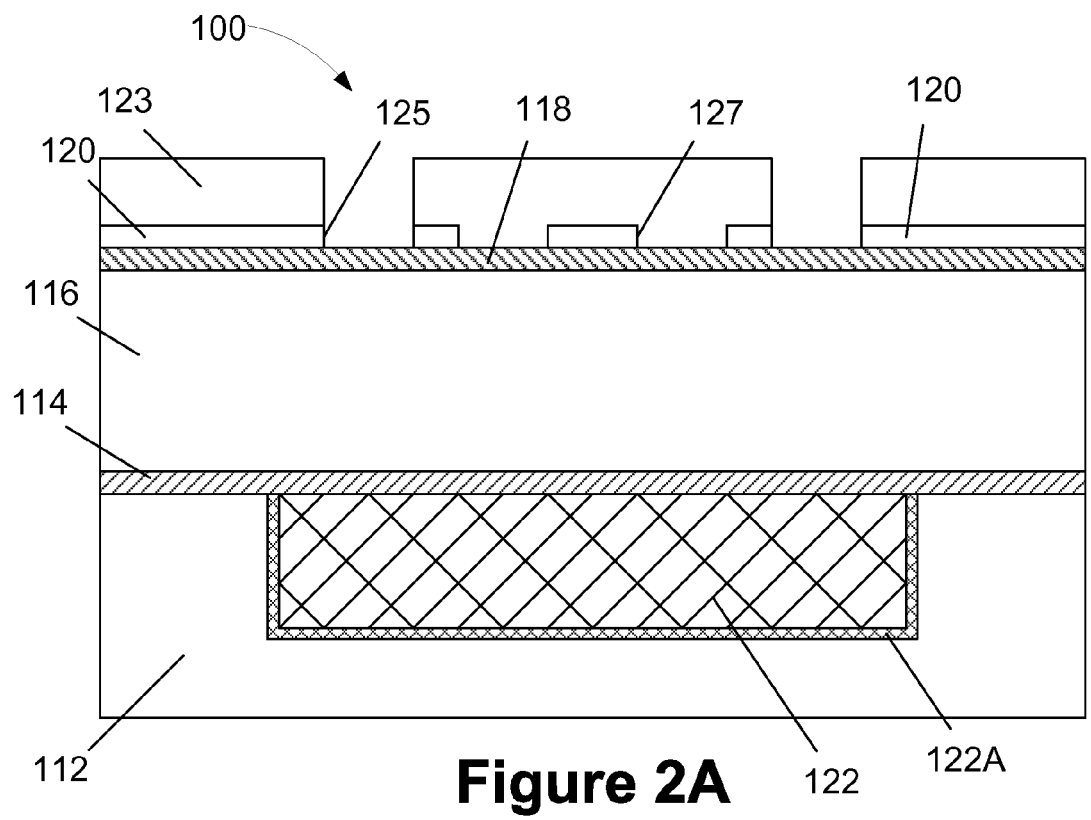
FIGS. 2A-2G depict various illustrative methods of forming copper-based conductive structures on a semiconductor device as disclosed herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming copper-based conductive structures, such as conductive lines and/or vias, on semiconductor devices, such as transistors. As will be readily apparent to those skilled in the art upon a complete reading of the present application, the methods disclosed herein are applicable to a variety of devices and technologies, e.g., NMOS, PMOS, CMOS, etc., and they may be readily employed in manufacturing a variety of integrated circuit products, including, but not limited to, ASIC's, logic devices, memory devices, etc. With reference to the attached drawings, various illustrative embodiments of the methods disclosed herein will now be described in more detail.

FIGS. 2A-2G depict various illustrative techniques disclosed herein that may be employed to form various copper conductive structures, e.g., copper lines and vias, on an integrated circuit device 100. FIG. 2A depicts the illustrative device 100 at a point of fabrication wherein the device 100 is comprised of a layer of insulating material 112, an etch stop layer 114, another layer of insulating material 116, a hard mask layer 118 and a patterned metal hard mask layer 120. Also depicted in FIG. 2A is a conductive copper structure 122 (with an illustrative barrier layer 122A), e.g., a copper line, positioned in the layer of insulating material 112. The layers of material depicted in FIG. 2A and the conductive copper structure 122 may be formed at any level in the integrated circuit device 100. For example, the conductive copper structure 122 may be part of a so-called "metal-1" layer for the device 100.

The various material layers depicted in FIG. 2A may be comprised of a variety of different materials and they may be formed using traditional manufacturing processes, such as CVD, PVD, atomic layer deposition (ALD), or plasma-enhanced versions of such processes, and the thickness of the individual layers may vary depending upon the particular application. For example, the layers of insulating material 112, 116 may be comprised of a low-k material (k value less than about 3.5), the etch stop layer 114 may be comprised of silicon nitride having a thickness of about 20-30 nm, the dielectric hard mask layer 118 may be a TEOS-based layer of silicon dioxide, and the metal hard mask layer 20 may be made of a metal such as, for example, titanium nitride, titanium, tantalum, tantalum nitride, etc.

With continuing reference to FIG. 2A, the metal hard mask layer 120 was initially patterned using a first mask layer (not shown), such as a patterned photoresist mask, to define openings 125 and 127 in the metal mask layer 120. Thereafter, the first mask layer was removed and a second mask layer 123 was formed above the patterned hard mask layer 120. The second mask layer 123 fills the openings 127 but not the openings 125 in the patterned metal hard mask layer 120. The second mask layer 123 may be comprised of a variety of different materials, e.g., photoresist, OPL, and it may be formed using known techniques.

Figure 2B:
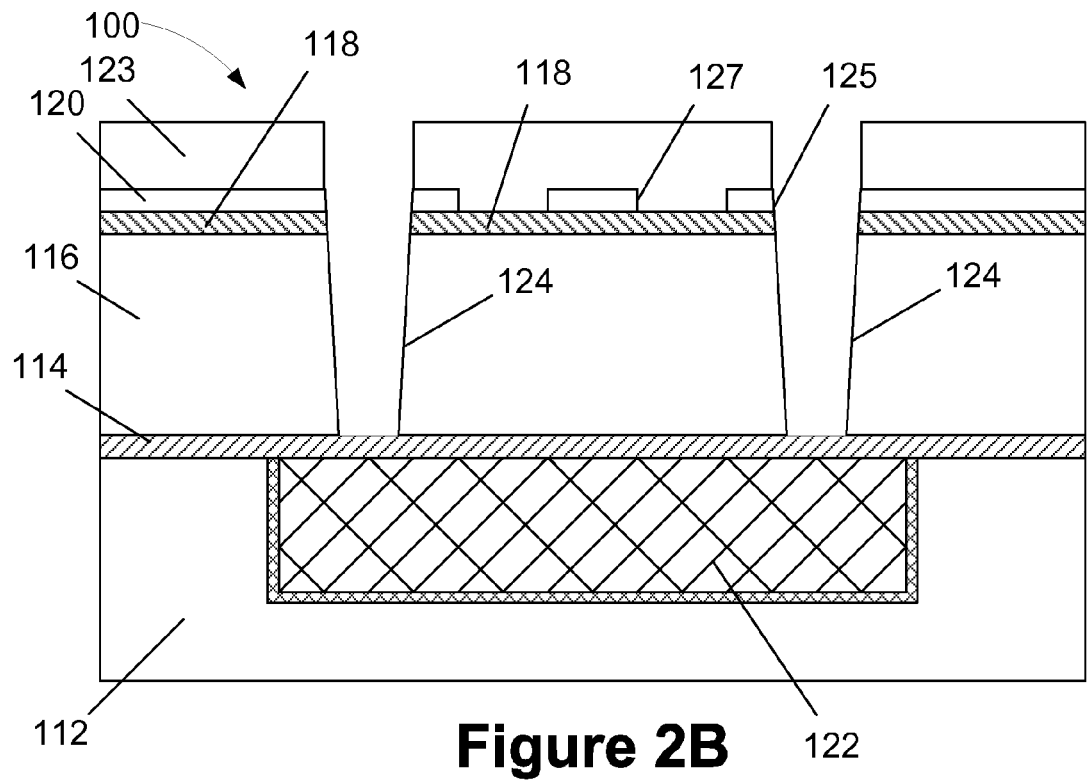

Next, as shown in FIG. 2B, one or more etching process are performed through the openings 125 in the patterned metal hard mask layer 120 to define illustrative via openings 124 that extend through the layer of insulating material 116 and stop on the etch stop layer 114. The via openings 124 may be of any size or configuration. During the etching process(es) performed to form the via openings 124, the etch chemistry may be changed so as to permit etching of the dielectric hard mask layer 118 and the layer of insulating material 116.

Figure 2C:
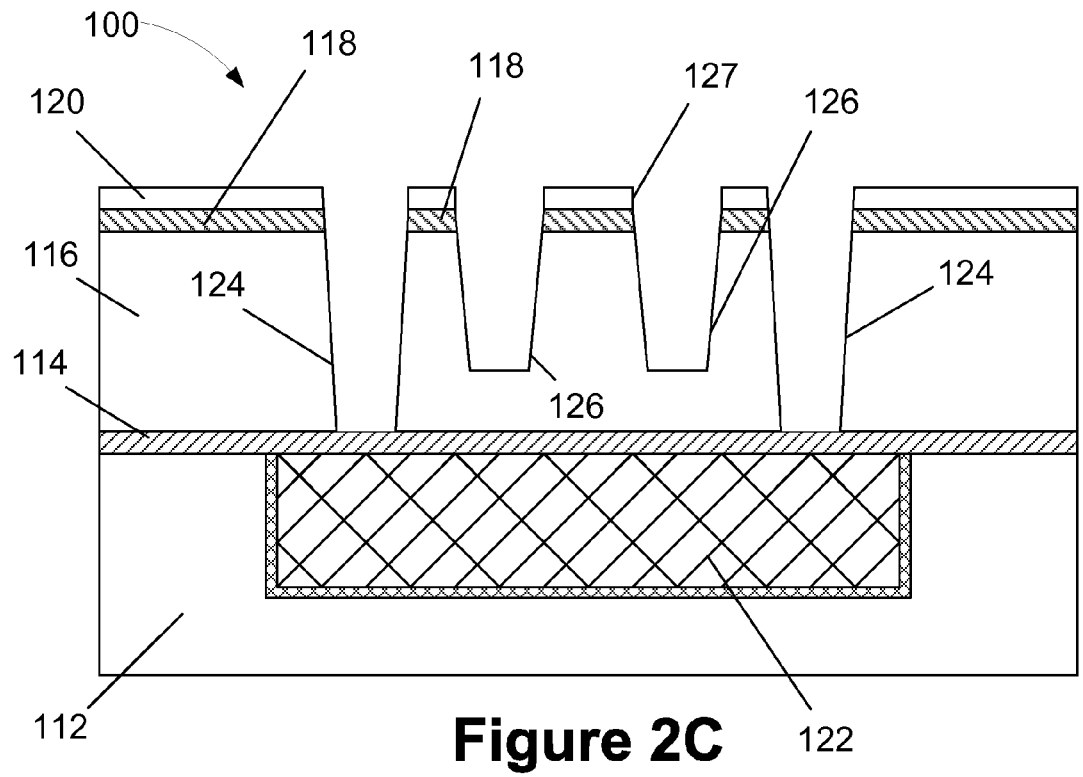

Next, as shown in FIG. 2C, the second mask layer 123 is removed by, for example, performing a stripping process when the second mask layer 123 is comprised of an OPL material. Thereafter, in one embodiment, the same etching process(es) described above to form the via openings 124 may again be performed through the openings 127 in the patterned metal hard mask layer 120 to form the trenches 126 in the layer of insulating material 116. In one illustrative example, various copper-based line-type features may be formed in the trenches 126. The trenches 126 may be of any size or configuration. The etching process performed to form the trenches 126 may be a timed etching process to control the depth of the trenches 126.

Figure 2D:
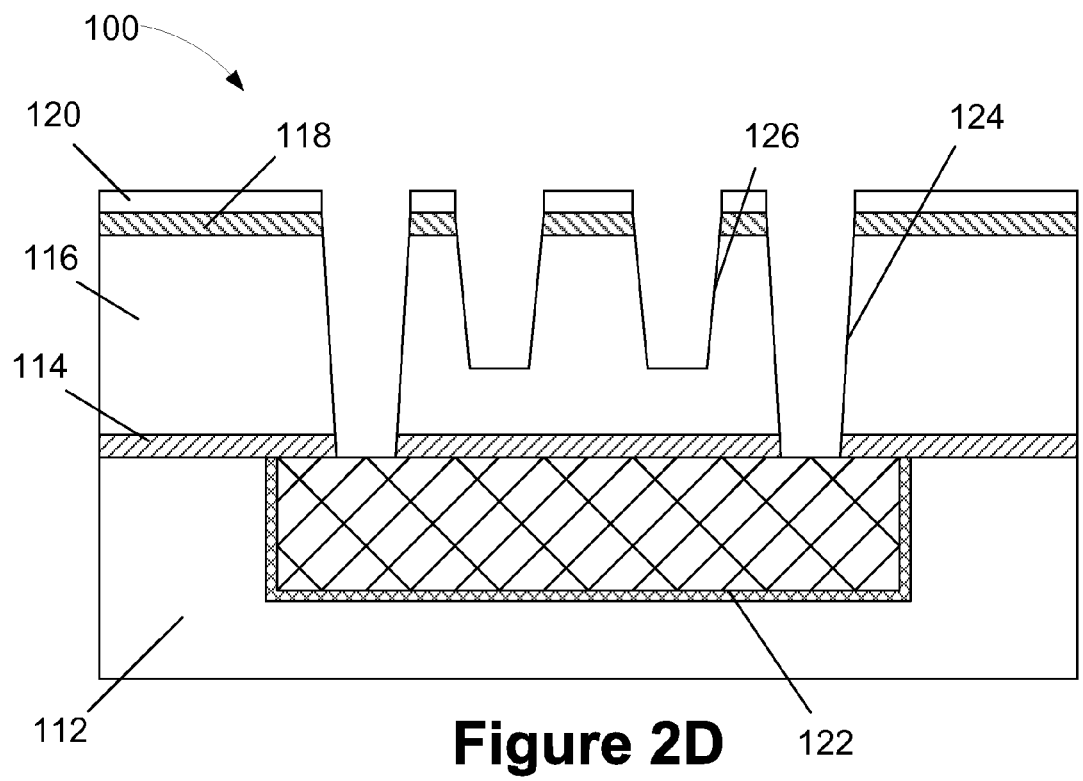

Next, as shown in FIG. 2D, one or more etching processes are performed on the etch stop layer 114 through the via openings 124 in the layer of insulating material 116 to thereby expose portions of the underlying conductive copper structure 122.

Figure 2E:
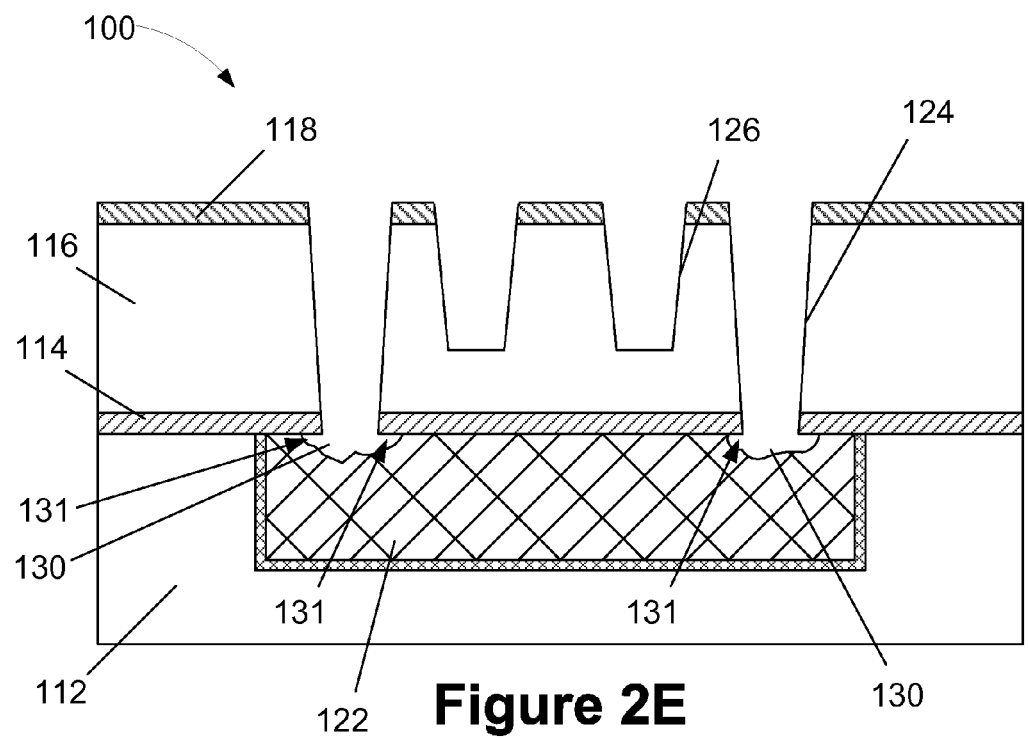

Next, as shown in FIG. 2E, a wet etching process is performed on the device 100 to remove the patterned metal hard mask 120. In the case where the metal hard mask 120 is comprised of titanium nitride, the wet etching process may be performed using diluted hydrogen peroxide ($H_2O_2$) or diluted ammonia ($NH_3OH$) and an $H_2O_2$ mixture. The etchants used in this wet etching process may comprise an oxidizing agent, such as, for example, hydrogen peroxide, which can oxidize metal structures, such as the metal hard mask 120, thereby facilitating its removal. However, as depicted, the wet etching process performed to remove the metal hard mask 120 also attacks the underlying copper conductive structure 122 and results in the formation of illustrative voids 130. The voids 130 tend to be non-uniform in nature and also tend to exhibit a significant degree of undercutting in the regions indicated by the arrows 131.

Figure 2F:
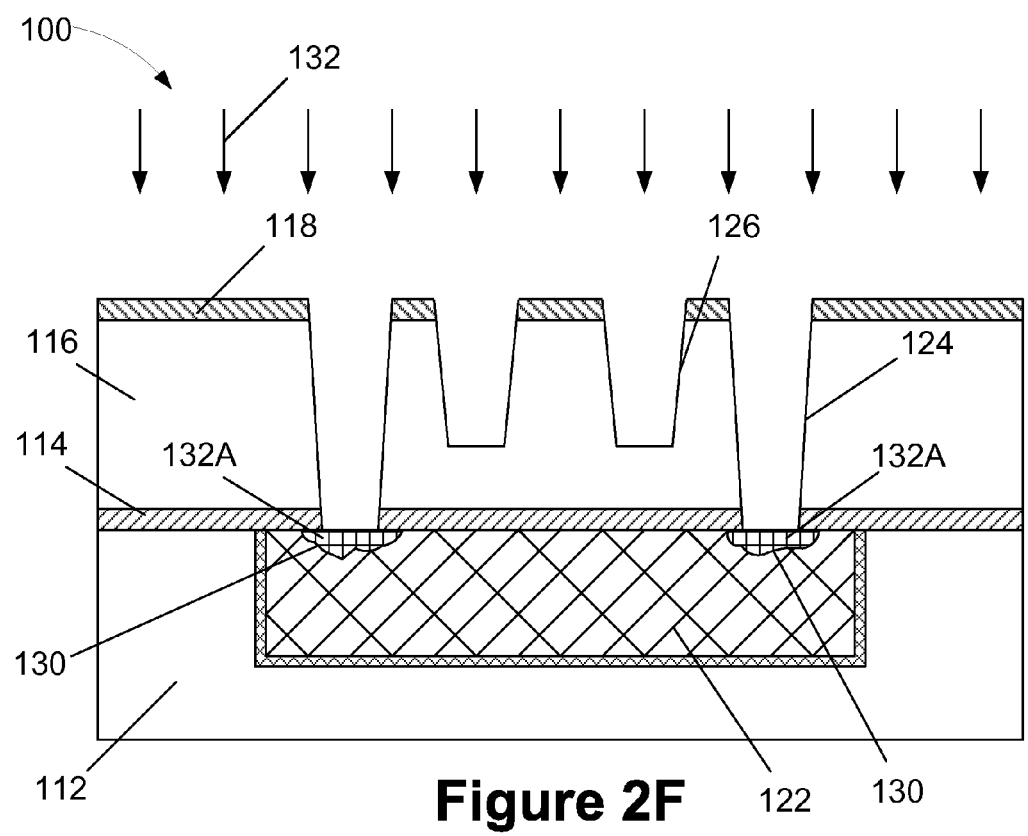

Next, as shown in FIG. 2F, a selective metal growth process 132 is performed on the device 100 to selectively grow metal regions 132A on the copper conductive structure 122 that substantially fills the voids 130. By substantially filling the voids 130, conductive copper structures (not shown in FIG. 2F) can be readily formed in the via openings 124. The selective metal growth process 132 may be a CVD or ALD process using materials such as, for example, copper, aluminum, cobalt or manganese. During such a selective metal growth process 132, the metal material grows substantially only on the exposed metal surfaces of the conductive copper structure 122, very little, if any, of the metal material is formed on the dielectric layers during the selective metal growth process 132. In one illustrative embodiment where cobalt is the material formed during the selective metal growth process 132, the process 132 may be performed at a temperature of about 50-400° C. and at a pressure of about 0.1-50 Torr using appropriate metal-containing precursors, e.g., a cobalt-containing precursor, a manganese-containing precursor, etc.

Figure 2G:
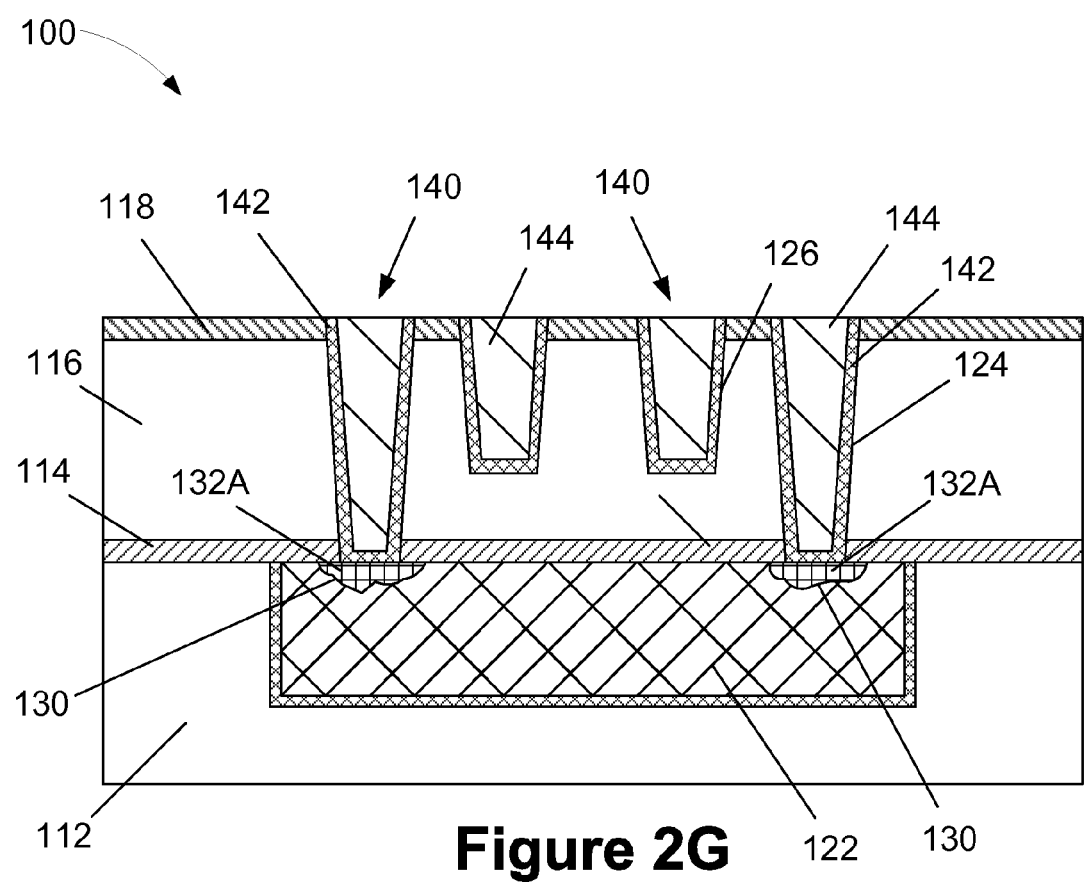

Next, as shown in FIG. 2G, conductive cooper-containing structures 140 are formed in the via openings 124 and the trenches 126 using known manufacturing techniques. The copper-based structures 140 formed in the via openings 124 are formed above the selectively deposited metal material 132A. In one illustrative embodiment, the conductive copper-containing structures 140 are comprised of an illustrative barrier layer 142 and a bulk copper region 144. The barrier layer 142 may be deposited in the openings 124, 126 by performing, for example, a plasma-enhanced atomic layer deposition (PEALD) process, a chemical vapor deposition (CVD) process or a physical vapor deposition (PVD) process. The barrier layer 142 may be comprised of a variety of different materials and the thickness of such a layer may vary. For example, the barrier layer 142 may be comprised of tantalum nitride (TaN), tantalum (Ta), titanium (Ti), titanium nitride (TiN), manganese (Mn), cobalt (Co) or ruthenium (Ru), etc. In one illustrative example, the bulk copper regions 144 may be formed by performing known electroplating or electroless plating processes. After the bulk copper is deposited, a chemical mechanical polishing (CMP) process may then be performed to remove the excess material positioned outside of the openings 124, 126.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   performing a first etching process through a patterned metal hard mask layer to define an opening in a layer of insulating material;
   performing a second etching process through said opening in said layer of insulating material to thereby expose a portion of an underlying copper-containing structure;
   after performing the second etching process, performing a wet etching process to remove said patterned metal hard mask layer;
   performing a selective metal deposition process through said opening in said layer of insulating material to selectively form a metal region on said copper-containing structure; and
   after forming said metal region, forming a copper-containing structure in said opening in said layer of insulating material above said metal region.

2. The method of claim 1, wherein said patterned metal hard mask layer is comprised of titanium nitride, titanium, tantalum or tantalum nitride.

3. The method of claim 1, wherein said wet etching process is performed using an oxidizing agent consisting of hydrogen peroxide or a mixture of ammonia and hydrogen peroxide.

4. The method of claim 1, wherein performing said wet etching process to remove said patterned metal hard mask layer creates a void in said underlying copper-containing structure and wherein said metal region substantially fills said void.

5. The method of claim 1, wherein said metal region is comprised of copper, manganese, aluminum or cobalt.

6. The method of claim 1, wherein forming said copper-containing structure in said opening in said layer of insulating material above said metal region comprises:

forming a barrier layer in said opening in said layer of insulating material that contacts said metal region; and forming a copper region in said opening in said layer of insulating material above said barrier layer.

7. The method of claim 1, wherein performing said selective metal deposition process comprises performing a chemical vapor deposition process or an atomic layer deposition process to form said metal region.

8. The method of claim 1, wherein said layer of insulating material is comprised of a low-k insulating material.

9. The method of claim 1, wherein performing said selective metal deposition process comprises performing said selective metal deposition process at a temperature within the range of about 50-400° C. and at a pressure within the range of about 0.1-50 Torr using a metal-containing precursor.

10. A method, comprising:

performing a first etching process through a patterned metal hard mask layer to define an opening in a layer of insulating material;

performing a second etching process through said opening in said layer of insulating material to thereby expose a portion of an underlying copper-containing structure;

after performing the second etching process, performing a wet etching process to remove said patterned metal hard mask layer, said wet etching process resulting in the formation of a void in said underlying copper-containing structure;

performing a selective metal deposition process through said opening in said layer of insulating material to selectively form a metal region that substantially fills said void in said copper-containing structure; and after forming said metal region, forming a copper-containing structure in said opening in said layer of insulating material above said metal region.

11. The method of claim 10, wherein said patterned metal hard mask layer is comprised of titanium nitride, titanium, tantalum or tantalum nitride.

12. The method of claim 10, wherein said wet etching process is performed using an oxidizing agent consisting of hydrogen peroxide or a mixture of ammonia and hydrogen peroxide.

13. The method of claim 10, wherein said metal region is comprised of copper, manganese, aluminum or cobalt.

14. The method of claim 10, wherein forming said copper-containing structure in said opening in said layer of insulating material above said metal region comprises:

forming a barrier layer in said opening in said layer of insulating material that contacts said metal region; and forming a copper region in said opening in said layer of insulating material above said barrier layer.

15. The method of claim 10, wherein performing said selective metal deposition process comprises performing a chemical vapor deposition process or an atomic layer deposition process to form said metal region.

16. The method of claim 10, wherein said layer of insulating material is comprised of a low-k insulating material.

17. The method of claim 10, wherein performing said selective metal deposition process comprises performing said selective metal deposition process at a temperature within the range of about 50-400° C. and at a pressure within the range of about 0.1-50 Torr using a metal-containing precursor.

18. A method, comprising:

performing a first etching process through a patterned metal hard mask layer to define an opening in a layer of insulating material;

performing a second etching process through said opening in said layer of insulating material to thereby expose a portion of an underlying copper-containing structure;

after performing the second etching process, performing a wet etching process to remove said patterned metal hard mask layer, said wet etching process resulting in the formation of a void in said underlying copper-containing structure;

performing a selective metal deposition process through said opening in said layer of insulating material to selectively form a metal region that substantially fills said void in said copper-containing structure, wherein said selective metal deposition process is one of a chemical vapor deposition process or an atomic layer deposition process and wherein said selective metal deposition process is performed at a temperature within the range of about 50-400° C. and at a pressure within the range of about 0.1-50 Torr using a metal-containing precursor; and after forming said metal region, forming a copper-containing structure in said opening in said layer of insulating material above said metal region.

19. The method of claim 18, wherein said patterned metal hard mask layer is comprised of titanium nitride, titanium, tantalum or tantalum nitride.

20. The method of claim 18, wherein said wet etching process is performed using an oxidizing agent consisting of hydrogen peroxide or a mixture of ammonia and hydrogen peroxide.

21. The method of claim 18, wherein said metal region is comprised of copper, manganese, aluminum or cobalt.

22. The method of claim 18, wherein forming said copper-containing structure in said opening in said layer of insulating material above said metal region comprises:

forming a barrier layer in said opening in said layer of insulating material that contacts said metal region; and forming a copper region in said opening in said layer of insulating material above said barrier layer.

* * * * *